US011031212B2

(12) United States Patent
Suguro

(10) Patent No.: US 11,031,212 B2
(45) Date of Patent: Jun. 8, 2021

(54) SEMICONDUCTOR MANUFACTURING APPARATUS

(71) Applicant: TOSHIBA ELECTRONIC DEVICES & STORAGE CORPORATION, Tokyo (JP)

(72) Inventor: Kyoichi Suguro, Kanagawa (JP)

(73) Assignee: TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 415 days.

(21) Appl. No.: 15/414,725

(22) Filed: Jan. 25, 2017

(65) Prior Publication Data

US 2017/0263420 A1  Sep. 14, 2017

(30) Foreign Application Priority Data

Mar. 14, 2016 (JP) .............................. JP2016-050086

(51) Int. Cl.
| | |
|---|---|
| *H01J 37/32* | (2006.01) |
| *C23C 16/511* | (2006.01) |
| *C23C 16/18* | (2006.01) |
| *C23C 16/30* | (2006.01) |
| *C23C 16/452* | (2006.01) |

(52) U.S. Cl.
CPC ........ *H01J 37/32229* (2013.01); *C23C 16/18* (2013.01); *C23C 16/303* (2013.01); *C23C 16/452* (2013.01); *C23C 16/511* (2013.01); *H01J 37/3244* (2013.01); *H01J 37/32192* (2013.01); *H01J 37/32357* (2013.01); *H01J 37/32724* (2013.01); *H01J 2237/3321* (2013.01)

(58) Field of Classification Search
USPC .............................. 118/723 MW; 156/345.41
See application file for complete search history.

(56) References Cited

U.S. PATENT DOCUMENTS

| | | | | | |
|---|---|---|---|---|---|
| 5,487,875 | A | * | 1/1996 | Suzuki .............. | H01J 37/32192 219/691 |
| 5,749,966 | A | * | 5/1998 | Shates ................... | C23C 16/511 117/79 |
| 5,776,253 | A | * | 7/1998 | Asakawa ................ | C23C 16/48 118/723 CB |
| 5,985,091 | A | | 11/1999 | Suzuki | |

(Continued)

FOREIGN PATENT DOCUMENTS

| | | |
|---|---|---|
| JP | H09-87851 A | 3/1997 |
| JP | H10-321619 A | 12/1998 |

(Continued)

OTHER PUBLICATIONS

English Machine Translation JP2000114240, Kitazawa et al (Year: 2000).*

*Primary Examiner* — Rakesh K Dhingra
(74) *Attorney, Agent, or Firm* — Foley & Lardner LLP

(57) ABSTRACT

A semiconductor manufacturing apparatus includes a first supply part configured to supply a gas including one or more group III elements on a substrate accommodated in a reaction chamber, a second supply part configured to supply a gas including one or more group V elements on the substrate, and a waveguide configured to irradiate a microwave to the gas including the one or more group V elements.

16 Claims, 7 Drawing Sheets

(56) References Cited

U.S. PATENT DOCUMENTS

| | | | | |
|---|---|---|---|---|
| 6,158,383 A * | 12/2000 | Watanabe | C23C 16/511 | 118/723 AN |
| 6,182,603 B1 * | 2/2001 | Shang | C23C 16/4404 | 118/715 |
| 7,314,835 B2 | 1/2008 | Ishizaka et al. | | |
| 8,580,670 B2 | 11/2013 | Butcher | | |
| 9,045,824 B2 | 6/2015 | Butcher | | |
| 2001/0024871 A1 * | 9/2001 | Yagi | C23C 16/303 | 438/604 |
| 2001/0052323 A1 * | 12/2001 | Yieh | C23C 16/452 | 118/725 |
| 2000/0182343 | 12/2002 | Yuda | | |
| 2003/0010446 A1 * | 1/2003 | Kajiyama | C23C 16/4404 | 156/345.1 |
| 2007/0163501 A1 * | 7/2007 | Ohmi | H01J 37/3244 | 118/723 MW |
| 2008/0134974 A1 * | 6/2008 | Takahashi | H01J 37/32633 | 118/715 |
| 2008/0272463 A1 * | 11/2008 | Butcher | C23C 16/303 | 257/615 |
| 2009/0029564 A1 * | 1/2009 | Yamashita | H05H 1/46 | 438/788 |
| 2009/0238996 A1 * | 9/2009 | Nakano | B01J 23/74 | 427/569 |
| 2010/0210067 A1 | 8/2010 | Butcher | | |
| 2010/0323529 A1 * | 12/2010 | Honda | H01J 37/32192 | 438/777 |
| 2011/0117728 A1 * | 5/2011 | Su | C23C 16/4404 | 438/478 |
| 2012/0086107 A1 * | 4/2012 | Yamamoto | C23C 16/405 | 257/632 |
| 2013/0075389 A1 * | 3/2013 | Ashida | H01J 37/32192 | 219/702 |
| 2013/0087093 A1 * | 4/2013 | Olgado | C30B 25/02 | 117/103 |
| 2013/0130513 A1 | 5/2013 | Miyatani et al. | | |
| 2014/0037865 A1 * | 2/2014 | Butcher | C23C 16/303 | 427/569 |
| 2014/0335288 A1 * | 11/2014 | Hirayama | H01J 37/32082 | 427/569 |
| 2015/0140788 A1 | 5/2015 | Hori et al. | | |

FOREIGN PATENT DOCUMENTS

| | | | |
|---|---|---|---|
| JP | 2000114240 | * | 4/2000 |
| JP | 2000-232256 A | | 8/2000 |
| JP | 2003-188104 A | | 7/2003 |
| JP | 2005-317670 A | | 11/2005 |
| JP | 2007-213994 A | | 8/2007 |
| JP | 2008-537979 A | | 10/2008 |
| JP | 4182648 B2 | | 11/2008 |
| JP | 2012-517711 A | | 8/2012 |
| JP | 2015-099866 A | | 5/2015 |
| JP | 2015-221740 A | | 12/2015 |
| WO | WO 2012/011480 A1 | | 1/2012 |
| WO | WO-2012/137949 A1 | | 10/2012 |

* cited by examiner

SEMICONDUCTOR MANUFACTURING APPARATUS

CROSS-REFERENCE TO RELATED APPLICATION

This application claims the benefit of and priority to Japanese Patent Application No. 2016-050086, filed Mar. 14, 2016, the entire contents of which are incorporated herein by reference.

FIELD

Embodiments described herein relate generally to a semiconductor manufacturing apparatus.

BACKGROUND

A film formation apparatus such as a MOCVD (Metal Organic Chemical Vapor Deposition) apparatus decomposes a group V material gas and an organic material gas including group III elements (e.g., Al, Ga, In) and causes decomposed materials to react and form a crystalline film, such as a nitride semiconductor on a semiconductor substrate. Ammonia ($NH_3$) can be used as the group V material gas. To improve $NH_3$ decomposition efficiency, a semiconductor substrate heated to more than 1000 degrees Celsius can be supplied. However, at these temperatures, warping of the semiconductor substrate by heating can be a problem.

On the other hand, when forming the nitride semiconductor at a temperature less than 1000 degrees Celsius, the group V material gas is decomposed into plasma separately from the group III material gas, generating ions and radicals. The group V material gas is often decomposed by using a shower head and a stage as electrodes at a frequency of about 60 MHz. However, the ions and the radicals of the group V material gas have a high energy due to an electric field applied between the shower head and the stage at a low frequency of 100 MHz or less, and can thus cause damage to the semiconductor substrate.

SUMMARY

In some embodiments according to one aspect, a semiconductor manufacturing apparatus includes a first supply part configured to supply a gas including one or more group III elements on a substrate accommodated in a reaction chamber, a second supply part configured to supply a gas including one or more group V elements on the substrate, and a waveguide configured to irradiate a microwave to the gas including the one or more group V elements.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

Embodiments relate to a semiconductor manufacturing apparatus capable of forming films while suppressing damage to a semiconductor substrate.

The semiconductor manufacturing apparatus according to some embodiments includes a first supply part configured to supply a gas including one or more group III elements, a second supply part configured to supply a gas including one or more group V elements on a substrate, and a waveguide configured to irradiate a microwave to the gas including the one or more group V elements with a microwave.

An embodiment according to one aspect will now be explained with reference to the accompanying drawings. This embodiment is not meant to be limiting.

In the description of some embodiments, when referring to two values or characteristics as being "about," "substantially," or "approximately" equal or the same, the terms can refer to a first value or characteristic being precisely the same or equal to a second value or characteristic, as well as cases where the first value or characteristic is within a range of variation of less than or equal to ±5% of the second value or characteristic, such as less than or equal to ±4%, less than or equal to ±3%, less than or equal to ±2%, or less than or equal to ±1%. When "about," "substantially," or "approximately" is used in conjunction with a numerical value, the terms can refer to a range of variation of less than or equal to ±5% of the numerical value, such as less than or equal to ±4%, less than or equal to ±3%, less than or equal to ±2%, or less than or equal to ±1%.

A First Embodiment

Figure 1:
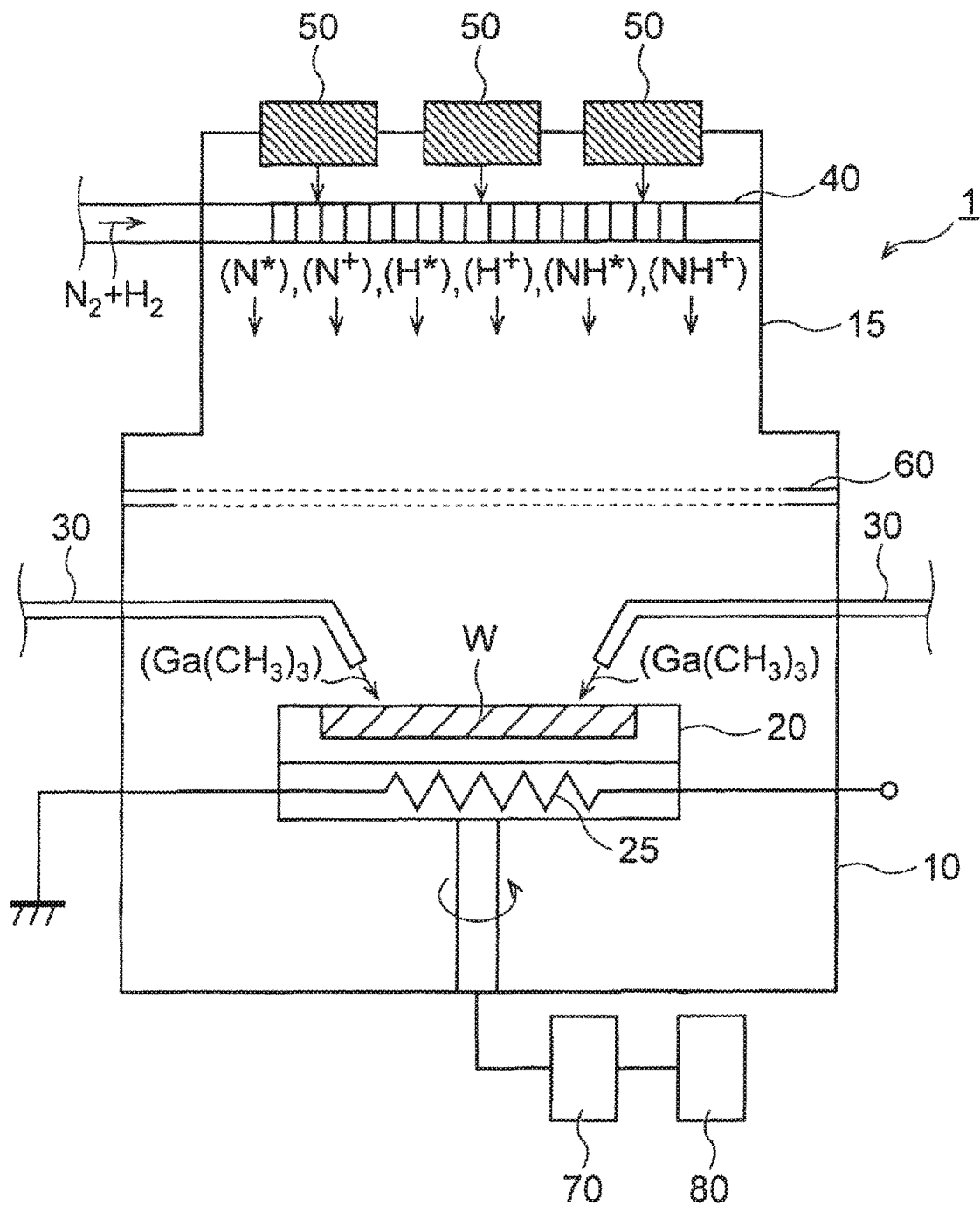
FIG. 1 is a schematic view showing an example of a structure of a MOCVD apparatus 1 according to a first embodiment.

FIG. 1 is a schematic view showing an example of a structure of a MOCVD (Metal Organic Chemical Vapor Deposition) apparatus 1 (hereinafter, the apparatus 1) according to a first embodiment. The apparatus 1 may be an epitaxial growth system configured to form semiconductor films such as GaN, AlN, GaAlN, and InN films. The apparatus 1 includes a chamber 10, a stage 20, a heater 25, a first supply part 30, a second supply part 40, waveguides 50, a filter 60, a driving part 70, and a controller 80.

An inside of the chamber 10 used as a reaction chamber is kept in a reduced pressure state by a vacuum pump (not shown in FIG. 1). The chamber 10 accommodates the stage 20, the heater 25, the first supply part 30, the second supply part 40, and the filter 60.

The stage 20 is capable of receiving and rotating a substrate W. The substrate W can be mounted on the stage 20. The substrate W may be for example, a silicon substrate, a sapphire substrate, or a SiC substrate.

The first supply part 30 is fluidly connected to the chamber 10 and supplies a gas including a group III element to the substrate W. For example, an organometallic gas including a group III element such as selected from Aluminum (Al), Gallium (Ga), Indium (In), and so forth may be supplied. The organometallic gas may be, for example, trimethylaluminum, trimethylgallium, triethylgallium, trimethylindium, or combinations thereof. The first supply part 30 includes, for example, a hollow nozzle, and supplies the gas including the group III element to a surface of the substrate W through the nozzle. The first supply part 30 also may include, or may be connected to, a source of the gas including the group III element.

The gas including the group III element is decomposed thermally on the substrate W and chemical species (e.g., atoms) of the group III element adhere on the surface of the substrate W. The first supply part 30 is located closer to the stage 20 and the substrate W than is the second supply part 40, that is, the first supply part 30 is located at a position lower than a position of the second supply part 40. Therefore, chemical species of the group III element adhere to the substrate W before bonding with chemical species of a group V element supplied from the second supply part 40. Thereafter, a group III-V compound crystalline film is formed.

The second supply part 40 is fluidly connected to the chamber 10 and supplies a gas including the group V element, such as selected from Nitrogen (N), Phosphorus (P), Arsenic (As), and so forth. The second supply part 40 supplies the gas including the group V element to a radical generating chamber 15 located at an upper portion of the chamber 10. The second supply part 40 includes, for example, a shower head. The second supply part 40 also may include, or may be connected to, a source of the gas including the group V element. The gas including the group V element is irradiated with a microwave from the waveguides 50 and are converted into plasma to form radicals and ions. The radicals derived from the gas including the group V element are supplied to the substrate W through the filter 60 and bond with atoms of the group III element adhered to the substrate W. Thereby, group III-V compound crystals are formed on the surface of the substrate W. When the second supply part 40 supplies the gas including the group V element such as nitrogen ($N_2$) and hydrogen ($H_2$) to the radical generating chamber 15, the gas is converted into plasma to form nitrogen radicals (N*), nitrogen ions ($N^+$), hydrogen radicals (H*), hydrogen ions ($H^+$), hydrogen nitride radicals (NH*), and hydrogen nitride ions ($NH^+$), and the plasma is supplied to the substrate W. Thereby, Gallium nitride (GaN) crystals are formed on the surface of the substrate W, for example.

Oxides (e.g., $Al_2O_3$, $Ga_2O_3$, $In_2O_3$) of group III elements (e.g., Al, Ga, In) are formed by using oxygen gas and hydrogen gas. In this case, the oxygen gas and the hydrogen gas are converted into plasma in the radical generating chamber 15 to form oxygen radicals (O*), oxygen ions ($O^+$), hydrogen radicals (H*), hydrogen ions ($H^+$), hydrogen oxide radicals (OH*), and hydrogen oxide ions ($OH^+$).

The waveguides 50 are located closer to the second supply part 40 than the first supply part 30. The microwave from the waveguides 50 is irradiated to the gas including the group V element supplied from the second supply part 40. The waveguides 50 are located above (e.g., directly above) the second supply part 40 on an upper surface of the chamber 10 (an upper surface of the radical generating chamber 15). The upper surface of the chamber 10 faces a surface of the stage 20 (the surface of the substrate W). The microwave from the waveguides 50 is irradiated to the gas including the group V element and thereby, the radicals and the ions are generated from the gas including the group V element. The microwave is an electromagnetic wave having a frequency range of about 300 MHz (megahertz) to about 300 GHz (gigahertz) and a wavelength range of about 1 mm (millimeter) to about 1 m (meter). Specifically, a microwave having a frequency in an industrial, scientific and medical (ISM) radio band having a center frequency of about 2.45 GHz or about 5.8 GHz, specified by the ISM standard, can be used. An arrangement of the waveguides 50 is described below in reference to FIG. 2 and FIG. 3.

The heater 25 is accommodated in the stage 20 as shown in FIG. 1. The heater 25 may be a hot plate capable of supporting the substrate W. The substrate W may be mounted on the heater 25. Alternatively the heater 25 may be a lamp or a laser irradiating the substrate W with light provided above the stage 20 (not shown in FIG. 1). The heater 25 is provided apart from the waveguides 50 and may be a microwave heater configured to irradiate microwave to the substrate W. The heater 25 can heat up the substrate W on the stage 20 to about 1000 degrees Celsius. In the present embodiment, the gas including the group V element is activated by the microwave irradiated by the waveguides 50. Therefore, the heater 25 may heat up the substrate W at a low temperature of about 1000 degrees Celsius or less. Thereby, a distortion or warping of the substrate W is suppressed.

The filter 60 is provided between the stage 20 and the radical generation chamber 15 and separates the radicals from the ions by blocking the high linearity ions. The ions which transfer in the vertical direction (up-and-down direction) to the surface of the substrate W are not able to pass through the filter 60, while the radicals are able to pass through the filter 60. Therefore, the filter 60 removes the ions which transfer in the up-and-down direction and passes the radicals to the side of the substrate W. A few ions may pass through the filter 60 by scattering, but do not cause significant damage to the substrate.

The driving part 70 rotates the stage 20 as shown by the arrow. The controller 80 controls the driving part 70 and a rotating speed of the stage 20 (a rotating cycle). The controller 80 may also control flow rates of the gasses from the first supply part 30 and the second supply part 40.

Figure 2:
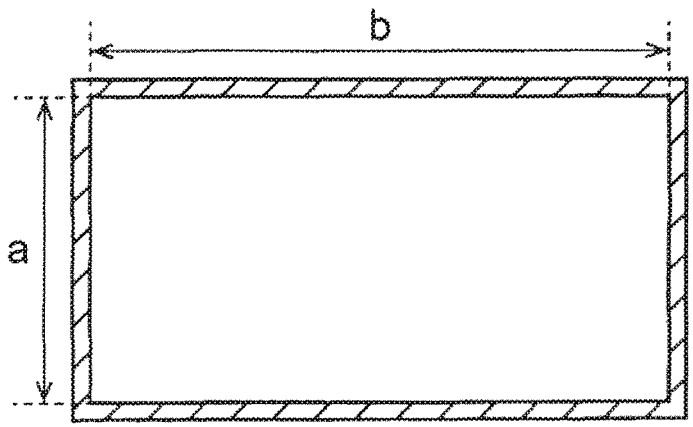
FIG. 2 is a cross-sectional view showing an example of a structure of waveguides 50 to irradiate a microwave.

FIG. 2 is a cross-sectional view showing an example of a structure of the waveguides 50 and showing the cross-sectional view, looking down in the irradiation direction of the microwave.

The waveguides 50 include hollow metal tubes. The waveguides 50 include an electric conductive metal such as copper. Dielectric loss and conductive loss of the waveguides 50 including the hollow metal tubes are suppressed. Therefore, the waveguides 50 are able to transmit the microwave a relatively long distance.

The waveguides 50 are respectively in a rectangle shape having a length a of a shorter side and a length b of a longer side in the depicted cross-sectional view. That is, an opening of the waveguide 50 is in a rectangular shape having the length a of the shorter side and the length b of the longer side. The length a and the length b are determined based on the frequency (wavelength) of the microwave transmitted through the waveguides 50. When the length b of the longer side is larger than half of the wavelength λ of the microwave, the microwave is transmitted while being reflected on the short side of an inner wall of the waveguide 50. However, when the length b of the longer side is substantially equal to half of the wavelength λ of the microwave, the microwave is not transmitted for the reason that the microwave overlaps with a reflected wave reflected in the short side of the waveguide 50 and forms a standing wave. The microwave is not transmitted as well when the length b of the longer side is smaller than half of the wavelength λ of the microwave. Therefore, it is desirable that the length b is larger than half of the wavelength λ of the microwave. But, when the opening of the waveguide 50 is too large, it can be difficult to place the large waveguides 50 in the chamber 10. Therefore, it is desirable that the length b is small while still being larger than half of the wavelength λ of the microwave.

When the frequency band of the microwave is about 2.45 GHz, the wavelength λ of the microwave is about 12.24 cm (centimeters). Therefore, it is desirable that the length b is larger than about 6.12 cm being half of the wavelength λ.

A transmission speed (group velocity) of the microwave in the waveguide 50 is represented by expression 1 shown below:

$$C \times \sqrt{(1-\lambda^2/4b^2)} \tag{1}$$

In expression 1 shown above, C is the transmission speed of the microwave in a space outside of the waveguide 50. According to expression 1, the larger the length b of the longer side is, the higher is the transmission speed of the microwave in the waveguide 50. Therefore, it is desirable that the length b of the longer side is larger. For example, the microwave can be transmitted though the waveguide 50 at high speed by using the waveguide 50 having a longer side of a length of about 6.12 cm or more, when the frequency band of the microwave is about 2.45 GHz.

As well, for example, when the frequency band of the microwave is about 5.8 GHz, the wavelength λ of the microwave is about 5.17 cm. In this case, it is desirable that the length b of the longer side is larger than half of the wavelength λ of the microwave (for example, about 2.585 cm). Thereby, the microwave is transmitted though the waveguide 50 at high speed. The frequency of the microwave may be about 2.45 GHz or more, and it is not limited.

The length a of the short side may be smaller than the length b of the longer side. Thereby, a dimension of the opening of the waveguide 50 becomes small and a reflected wave of a microwave from another waveguide mostly does not enter the waveguide 50, thus suppressing interference. That is, mutual interference of the microwaves transmitted through a plurality of the waveguides 50 is suppressed, and the waveguides 50 sufficiently supply the microwaves in the radical generating chamber 15.

Figure 3:
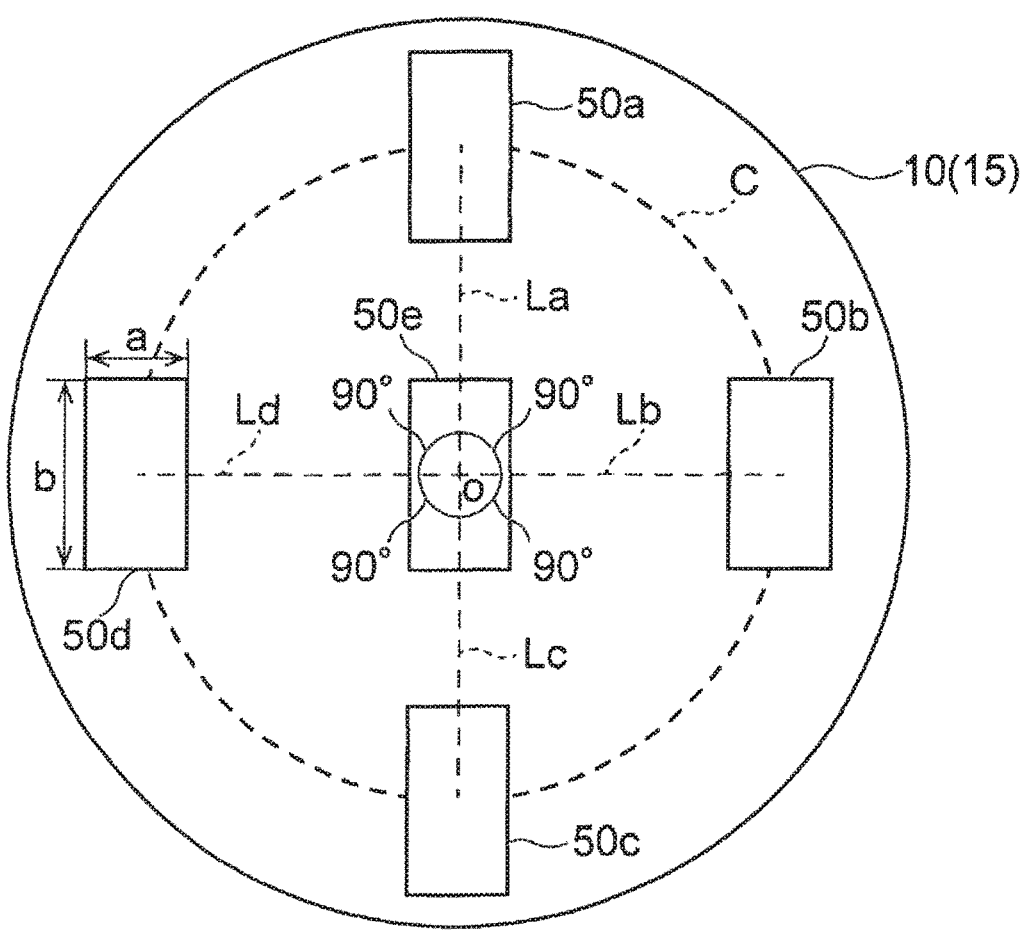
FIG. 3 is a top view showing an example of an arrangement of a plurality of the waveguides 50.

FIG. 3 is a top view showing an example of an arrangement of the plurality of waveguides 50. That is, FIG. 3 is the top view of the upper surface of the chamber 10 (the radical generating chamber 15). The surface of the chamber 10 is located above the surface of the substrate W and in a circular shape. A single waveguide 50e is located at approximately a center or a center of a gravity of the chamber 10, or at approximately a center axis of the chamber 10. A plurality of other waveguides 50a to 50d are located at approximately equal intervals on a same concentric circle C which is centered around approximately the center or the center of the gravity of the chamber 10, or around the center axis of the chamber 10. In the present embodiment, the four waveguides 50a to 50d are located at approximately equal intervals on a same concentric circle C which is centered around approximately a center of the chamber 10. The openings of the waveguides 50a to 50e are directed toward the second supply part 40 (and the stage 20 and the substrate W), and the microwaves are irradiated downward from the openings. The longer sides of the waveguides 50a to 50e are approximately parallel to each other.

A straight line connecting between the waveguide 50a and the center O of the concentric circle C is defined as a straight line La. A straight line connecting between the waveguide 50b adjacent to the waveguide 50a and the center O is defined as a straight line Lb. A straight line connecting between the waveguide 50c adjacent to the waveguide 50b and the center O is defined as a straight line Lc. A straight line connecting between the waveguide 50d adjacent to the waveguide 50c and the center O is defined as a straight line Ld. In this case, an angle between the straight line La and the straight line Lb relative to the center O is about 90 degrees. Similarly, an angle between the straight line Lb and the straight line Lc relative to the center O is about 90 degrees. An angle between the straight line Lc and the straight line Ld relative to the center O is about 90 degrees. An angle between the straight line Ld and the straight line La relative to the center O is about 90 degrees. In this way, when a straight line connecting between an adjacent waveguide 50 in the concentric circle and the center O is defined as a first straight line and a straight line connecting between another adjacent waveguide 50 and the center O is defined as a second straight line, an angle between the first and the second straight lines is approximately equal to an angle between each pair of straight lines in any two adjacent waveguides 50 in the concentric circle C. That is, a center angle between any two adjacent waveguides 50 relative to the center O is approximately equal. Therefore, the waveguides 50a to 50e are spaced evenly on the surface of the chamber 10 (the radical generating chamber 15) and the microwave is evenly irradiated to the gas including the group V element supplied to the radical generating chamber 15 from the second supply part 40.

The substrate rotates at about 1000 rpm (rotation per minute), which causes the radicals of the gas including the group V element to distribute evenly on the surface of the substrate W.

However, when the waveguides 50a to 50e are not spaced evenly, a low rotating speed of the substrate W can cause the radicals of the gas including the group V element to be distributed unevenly.

In the present embodiment, the waveguides 50a to 50e are spaced evenly with respect to the center of the surface of the chamber 10. Therefore, apparatus 1 supplies the radicals of the gas including the group V element evenly and forms material films with uniform film quality and film thickness on the surface of the substrate W.

In a comparative example that uses a shower head and a stage as electrodes, the microwaves may not be well introduced into the chamber 10. And when the group V material gas is decomposed by using the shower head and the stage at a relatively low frequency of about 60 MHz, the ions have a high energy due to an electric field and may cause damage by a collision with a semiconductor substrate.

The apparatus 1 according to the present embodiment directly irradiates the microwaves having the relatively high frequency band of about 5.8 GHz, or about 2.45 GHz, to the gas including the group V element by using the waveguides 50. Thereby, kinetic energy of nitrogen radicals, nitrogen ions, hydrogen radicals, and hydrogen ions generated from the gas including the group V element becomes low and damage to the substrate W is suppressed. Damage to the substrate W can be a crystal defect generated on the surface of the substrate W by removing atoms of a crystal lattice.

Besides, the irradiation from the waveguides 50 is different from a microwave annealing. The microwave annealing heats or modifies the substrate W by irradiating the microwave to the substrate W. However, the irradiation of the microwave from the waveguides 50 according to the present embodiment is directed to the gas including the group V element for activation. Also, the waveguides 50 are closer to the second supply part 40 than the first supply part 30, and therefore, do not irradiate the microwave to the gas including group III element. In this way, the apparatus 1 is able to activate the gas including the group V element without decomposing the gas including group III element.

A Modified Example of the First Embodiment

Figure 4:
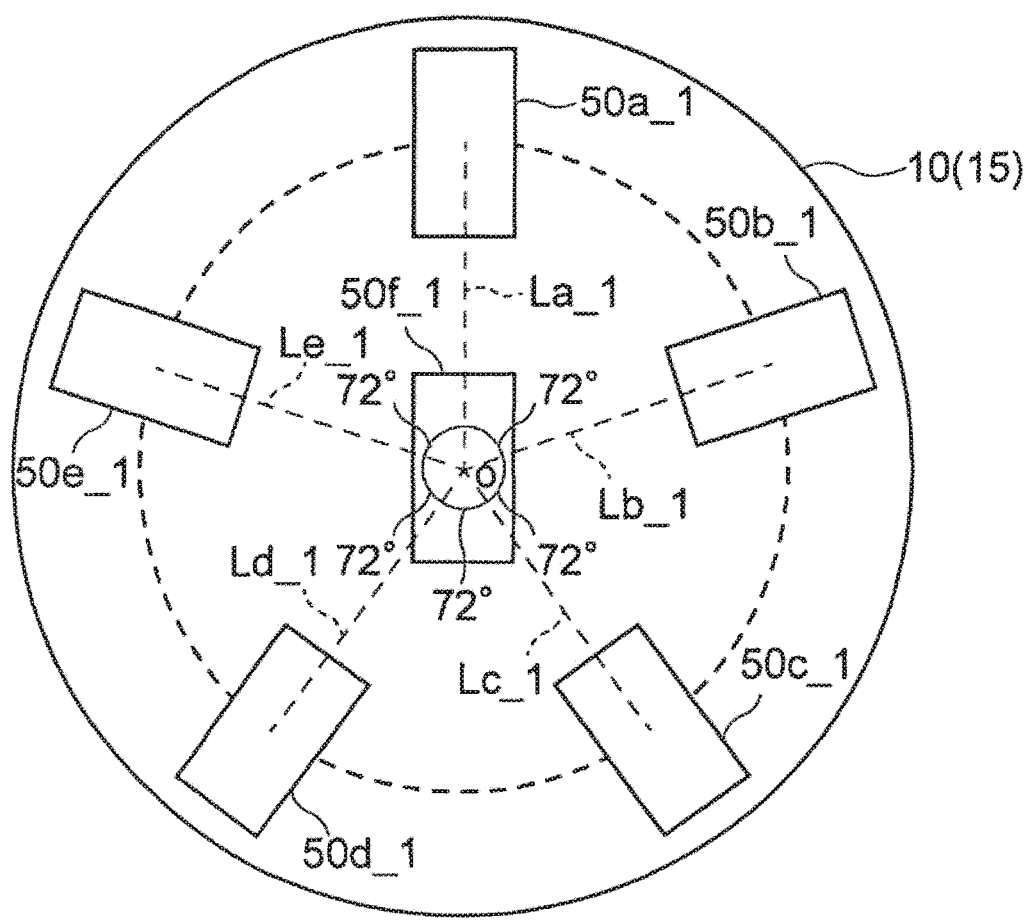
FIG. 4 is a top view showing an example of an arrangement of the plurality of the waveguides 50 according to a modified example of the first embodiment.

FIG. 4 is a top view showing an example of an arrangement of the plurality of waveguides 50 according to a modified example of the first embodiment. A single waveguide 50f_1 is located at approximately the center or the center of gravity of the upper surface of the chamber 10. And other waveguides 50a_1 to 50e_1 are located at approximately equal intervals on the concentric circle C around approximately the center or the center of the gravity of the upper surface of the chamber 10. In the modified example, the five waveguides 50a_1 to 50e_1 are located at approximately equal intervals and spaced evenly on the same concentric circle C around approximately the center of the upper surface of the chamber 10. The openings of the waveguides 50a_1 to 50f_1 are directed toward the second supply part 40, the stage 20, and the substrate W and the microwave is irradiated downward from the openings. The longer sides b of the waveguides 50a_1 to 50e_1 are arranged in the irradiation direction around the center O. The other components of the present modified example may be similar to corresponding components of the first embodiment.

A straight line connecting between the waveguide 50a_1 and the center O of the concentric circle C is defined as a straight line La_1. A straight line connecting between the waveguide 50b_1 adjacent to the waveguide 50a_1 and the center O is defined as a straight line Lb_1. A straight line connecting between the waveguide 50c_1 adjacent to the waveguide 50b_1 and the center O is defined as a straight line Lc_1. A straight line connecting between the waveguide 50d_1 adjacent to the waveguide 50c_1 and the center O is defined as a straight line Ld_1. A straight line connecting between the wave guide 50e_1 adjacent to the waveguide 50d_1 and the center O is defined as a straight line Le_1. In this case, an angle between the straight line La_1 and the straight line Lb_1 relative to the center O is about 72 degrees. Similarly, an angle between the straight line Lb_1 and the straight line Lc_1 relative to the center O is about 72 degrees. An angle between the straight line Lc_1 and the straight line Ld_1 relative to the center O is about 72 degrees. An angle between the straight line Ld_1 and the straight line Le_1 relative to the center O is about 72 degrees. An angle between the straight line Le_1 and the straight line La_1 relative to the center O is about 72 degrees. In this way, when a straight line connecting between one adjacent waveguide 50 in the concentric circle C and the center O is defined as a first straight line and a straight line connecting between another adjacent waveguide 50 and the center O is defined as a second straight line, an angle between the first and the second straight lines is approximately equal to an angle between each pair of straight lines which connect each of two adjacent waveguides 50 to the center O. That is, center angles between each pair of straight lines which connect each of two adjacent waveguides 50 to the center O are approximately equal. Therefore, the waveguides 50a_1 to 50f_1 are spaced evenly on the upper surface of the chamber 10 (the radical generating chamber 15) and the microwave is evenly irradiated to the gas including the group V element supplied to the radical generating chamber 15 from the second supply part 40. The present modified example has a similar effect as the first embodiment. Also, the longer sides b of the waveguides 50a_1 to 50e_1 are arranged in the irradiation direction around the center O. Furthermore, for each waveguide 50a_1 to 50e_1, a straight line going through a middle of a first short side and a middle of a second short side, when extended, crosses the center o. Therefore, the apparatus 1 evenly irradiates the microwave to the gas including the group V element supplied to the radical generating chamber 15.

The number of waveguides 50 need not be five or six. In some other embodiments, the number of waveguides 50 can be any appropriate number of waveguides, such as, for example, four or less waveguides, or seven or more waveguides.

A Second Embodiment

Figure 5:
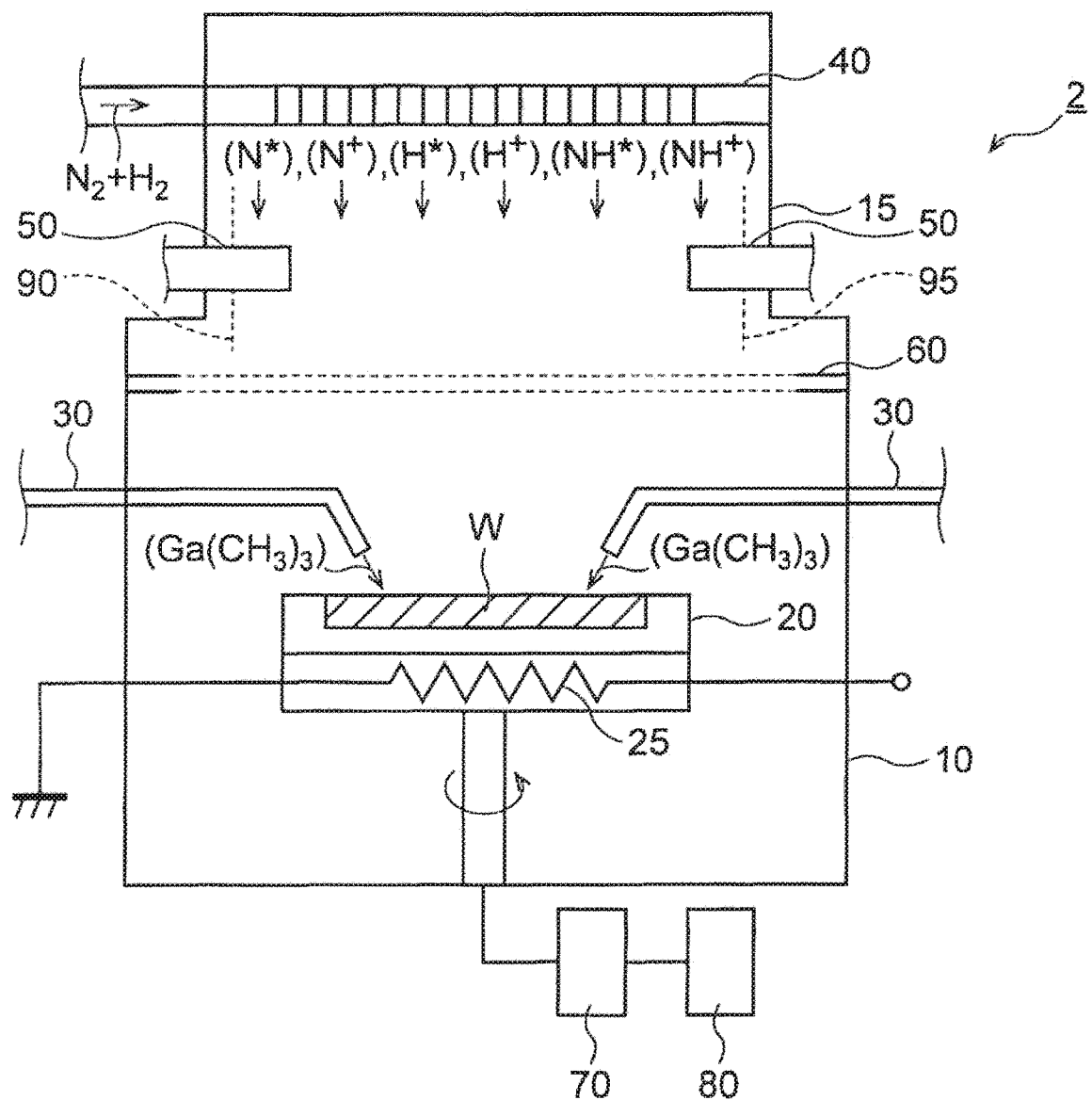
FIG. 5 is a schematic view showing an example of a structure of a MOCVD apparatus 2 according to a second embodiment.

FIG. 5 is a schematic view showing an example of a structure of a MOCVD apparatus 2 (hereinafter, the apparatus 2). According to the second embodiment, the waveguides 50 are provided on the side wall of the chamber 10 (the radical generating chamber 15). The other components of the second embodiment may be similar to corresponding components of the first embodiment.

The waveguides 50 are arranged in a position lower than a position of the shower head in the second supply part 40 and in a position higher than positions of the substrate W, the stage 20, the first supply part 30, and the filter 60. That is, the waveguides 50 are arranged in a position between the first supply part 30 and the second supply part 40. Also, the openings of the waveguides 50 are directed in an approximately longitudinal direction to the inside of the chamber 10 and the microwave is irradiated in the approximately longitudinal direction to the inside of the chamber 10 from the openings. The openings of the microwaves 50 are in a rectangular shape having a shorter side a and a longer side b.

Figure 6:
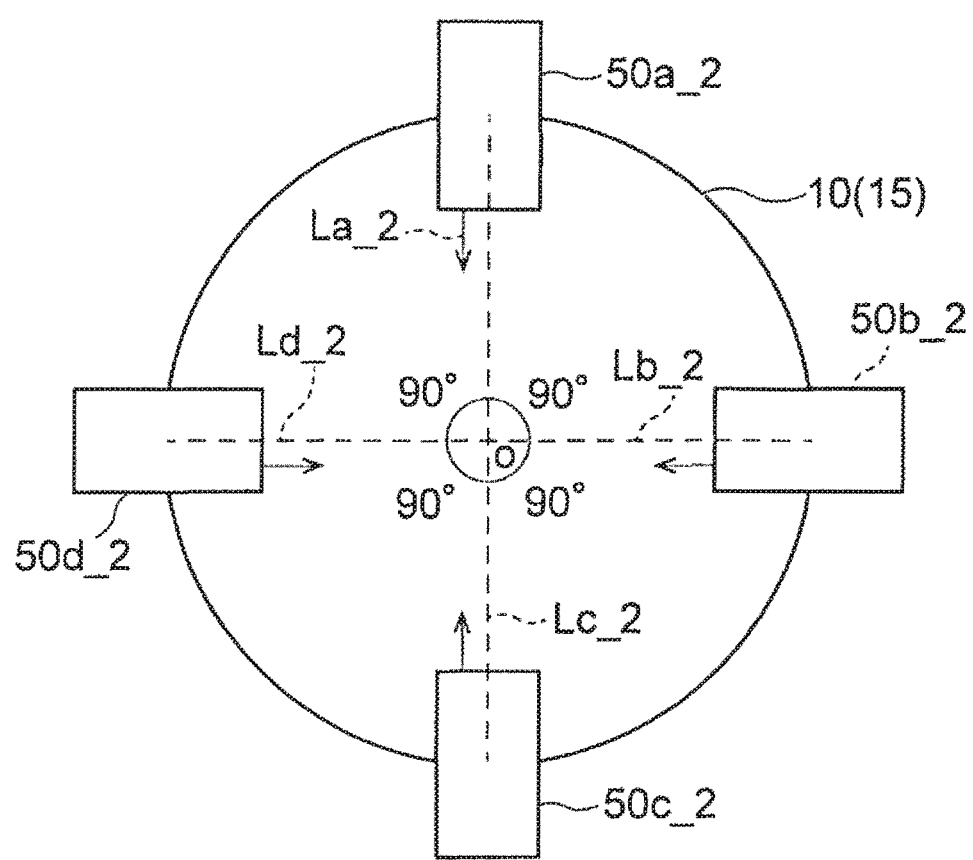
FIG. 6 is a top view showing an example of an arrangement of a plurality of waveguides 50.

FIG. 6 is a cross-sectional view showing an example of an arrangement of the plurality of the waveguides 50. FIG. 6 shows a cross-sectional view taken approximately parallel to the substrate W or the upper surface of the stage 20. In the cross-sectional view shown in FIG. 6, the plurality of the waveguides 50a_2 to 50d_2 are located at approximately equal intervals on the concentric circle C around approximately the center or the center of the gravity of the upper surface of the chamber 10. In the second embodiment, the four waveguides 50a_2 to 50d_2 are arranged evenly on the concentric circle C. The openings of the waveguides 50a_2 to 50d_2 are directed toward the center O and the microwave is irradiated from the openings toward the center C in directions shown by arrows.

When a straight line connecting between one adjacent waveguide 50 and the center O is defined as a first straight line and a straight line connecting between another adjacent waveguide 50 and the center O is defined as a second straight line, an angle between the first and the second straight lines is approximately equal to an angle between each pair of straight lines which connect each of two adjacent waveguides 50 to the center O. That is, center angles between each pair of straight lines which connect each of two adjacent waveguides 50 to the center O are approximately equal. Therefore, the waveguides 50a_2 to 50d_2 are spaced evenly in the radical generating chamber 15 and the microwave is evenly irradiated to the gas including the group V element supplied to the radical generating chamber 15 from the second supply part 40.

According to the second embodiment, the waveguides 50a_2 to 50d_2 are provided on the side wall of the chamber 10 (the radical generating chamber 15) in a position between the first supply part 30 and the second supply part 40. Also, in the cross-sectional view taken in an approximately parallel direction to the substrate W or the surface of the stage 20, the waveguides 50a_2 to 50d_2 are arranged evenly (approximately equal intervals) relative to the center O of the chamber 10 (the radical generating chamber 15). Therefore, the waveguides 50a to 50d evenly irradiate the microwave to the gas including the group V element supplied to the radical generating chamber 15. The apparatus 2 according to the second embodiment has a similar effect as the first embodiment.

The apparatus 2 according to the second embodiment supplies the microwave having a relatively high frequency band (for example, about 5.8 GHz, or about 2.45 GHz) to the gas including the group V element. The apparatus 2 converts the gas including the group V element into a plasma by the microwave having a relatively high frequency band without using the shower head or the stage 20 as the electrode. Thereby, a decomposition of the gas including group III element is suppressed and a damage to the substrate W is suppressed. The second embodiment also shares other advantages with the first embodiment.

The apparatus 2 may have a reflector 90 or 95 of the microwave on the inside wall of the radical generating chamber 15 as shown in FIG. 5. The reflector 90 or 95 reflects the microwave multiple times and the microwave reflected by the reflector 90 or 95 is efficiently irradiated to the gas including the group V element. Thereby, the gas including the group V element is efficiently activated (radicalized).

A Modified Example of the Second Embodiment

Figure 7:
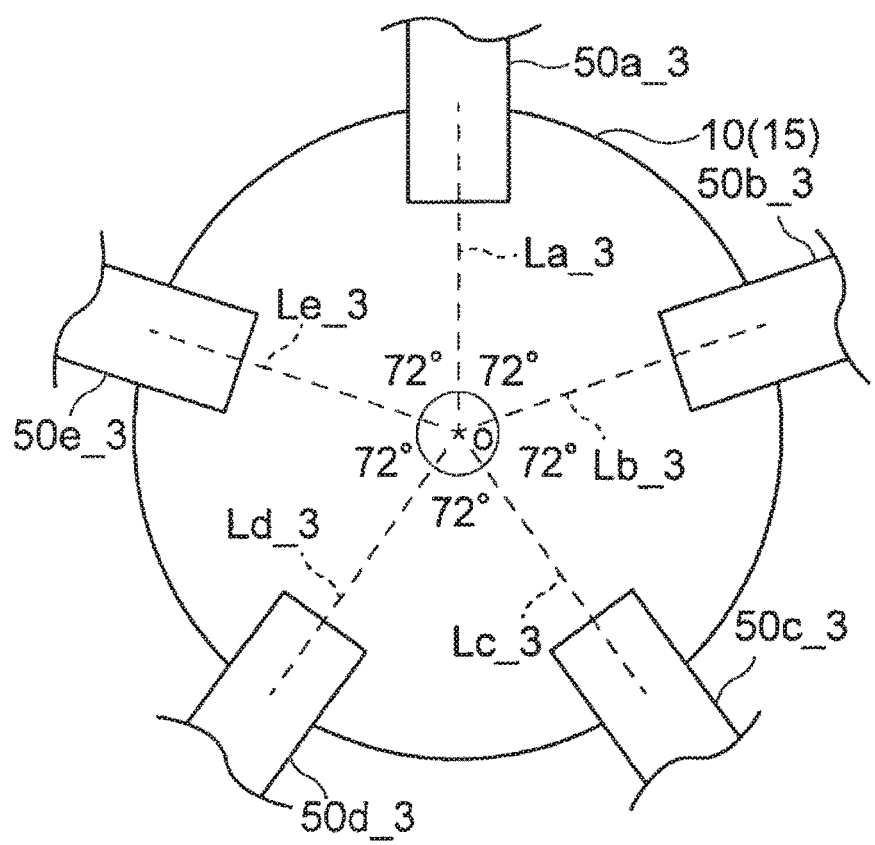
FIG. 7 is a top view showing an example of an arrangement of the plurality of the waveguides 50 according to a modified example of the second embodiment.

FIG. 7 is a cross-sectional view showing an example of an arrangement of the plurality of the waveguides 50 according to a modified example of the second embodiment. FIG. 7 shows a cross-sectional view taken in an approximately parallel direction to the substrate W or the surface of the stage 20. The plurality of the waveguides 50a_3 to 50e_3 are provided on the inside wall of the chamber 10 (the radical generating chamber 15) and the number of the waveguides 50 is five. The other components of the present modified example may be similar to corresponding components of the second embodiment.

The present modified example has a similar effect as the second embodiment. The number of waveguides 50 need not be five or six. In some other embodiments, the number of waveguides 50 can be any appropriate number of waveguides, such as, for example, four or less waveguides, or seven or more waveguides.

A Shower Head of the Second Supply Part 40

Figure 8A:
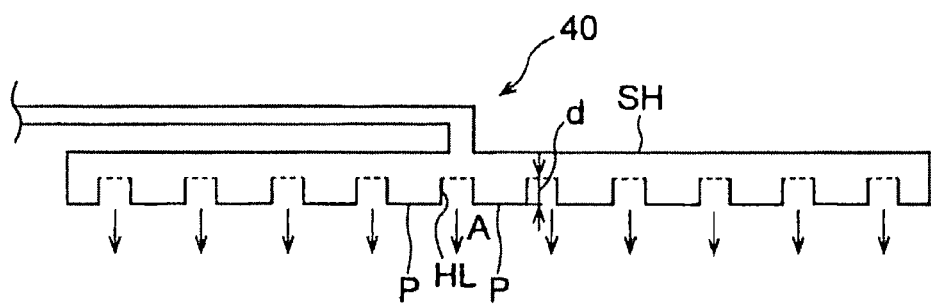
FIG. 8A is a cross-sectional view showing an example of a structure of a shower head SH of a second supply part 40.
Figure 8B:
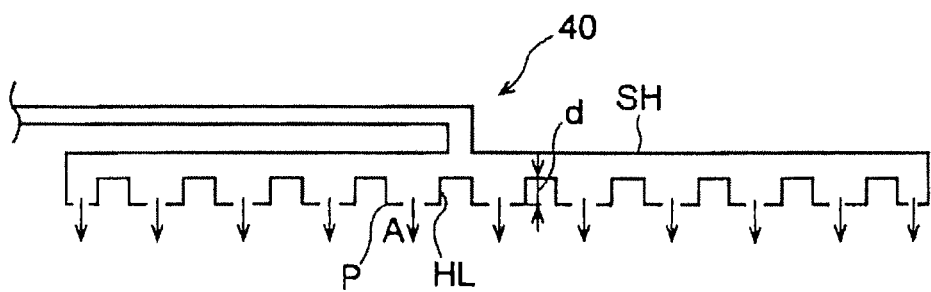
FIG. 8B is a cross-sectional view showing an example of a structure of a shower head SH of a second supply part 40.

FIG. 8(A) and FIG. 8(B) are a cross-sectional view showing an example of a structure of the shower head SH of the second supply part 40. The shower head SH has or defines a plurality of holes HL on a bottom surface facing the substrate W so as to supply the radicals of the gas including the group V element to the substrate W. The holes HL are arranged evenly on the bottom surface of the shower head SH so as to supply the radicals to the substrate W evenly. As described below, the gas including the group V element is efficiently radicalized or ionized through the holes HL adjusted by depth properly.

A non-electric conductor, or an insulator, such as quartz is used for the shower head SH. The gas including the group V element inside and outside of the shower head SH is sufficiently irradiated by the microwave because of a transmission of the microwave through the quartz. The microwave is not sealed by the shower head SH and radicalizes or ionizes the gas including the group V element. Also, the shower head SH is not used as an electrode and need not be an electric conductor.

The shower head SH may be coated to suppress a mixing of compositions of the quartz into deposition films. A coating material of the shower head SH is desirably a group III nitride (for example, AlN, GaN, and InN) when a film forming material is group III nitride. The coating material is desirably the same as the film forming material, or may be a different group III nitride from the film forming material. In this case, the shower head SH comprises the quartz coated with the film forming material. Or a coating material may be a group III oxide (for example, $Al_2O_3$, $Ga_2O_3$, and $In_2O_3$) when a film forming material is group III oxide. In this case, the coating material is desirably the same as the film forming material, or may be a different group III oxide from the film forming material.

As described above, coating the shower head SH with the film forming material or a similar material prevents the composition of the shower head SH (for example, the quartz) from mixing into the deposition films by irradiating with the microwave.

An optimal depth d (length) of the holes of the shower head SH depends on a frequency band of the microwave. In case of the microwave having a frequency of about 2.45 GHz, a relation between a concentration of the radicals or the ions of the gas including the group V element and the depth d of the holes of the shower head SH is as follows. The concentration of the radicals or the ions is about $2\times10^{12}/cm^3$ when the depth d of the holes is about 1 mm or less. The concentration of the radicals or the ions is about $5\times10^{12}/cm^3$ when the depth d of the holes is about 5 mm. The concentration of the radicals or the ions is about $4.3\times10^{12}/cm^3$ when the depth d of the holes is about 10 mm. The concentration of the radicals or the ions is about $3.5\times10^{12}/cm^3$ when the depth d of the holes is about 20 mm. The concentration of the radicals or the ions is about $2.8\times10^{12}/cm^3$ when the depth d of the holes is about 30 mm. Therefore, in case of the microwave having the frequency of about 2.45 GHz, the depth d of the holes is about 5 mm when the concentration (a density) of the radicals or the ions have a maximum value.

Thus, the gas including the group V element through the holes HL with the optimal depth d is efficiently radicalized or ionized and the concentration (the density) of the radicals or the ions become larger. Thereby, the material films is efficiently formed on the substrate W.

As shown by an arrow A in FIG. 8(A) and FIG. 8(B) the radicals and the ions of the gas including the group V element exit from the shower head SH through the holes HL. As shown in FIG. 8(A), the holes HL may be provided on a bottom portion between adjacent protrusions P. Or as shown in FIG. 8(B), the holes HL may be provided on a top portion of the protrusions P.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor manufacturing apparatus, comprising:
a reaction chamber configured to accommodate a substrate, the reaction chamber including a first chamber and a second chamber, the first chamber connected to a source of gas including gallium or indium, the second chamber connected to a source of gas including a group V element, and a hydrogen gas, and generating a plasma therein;
a nozzle connected to the first chamber, the nozzle configured to supply the gas including gallium or indium to the substrate;
a shower head connected to the second chamber, the shower head comprising a plurality of holes directed toward the substrate, the shower head configured to supply the gas including the group V element and hydrogen gas toward the substrate;
a plurality of waveguides, each waveguide of the plurality of waveguides comprising an opening configured to direct a microwave to irradiate the gas including the group V element and the hydrogen gas to generate radicals of the group V element, ions of the group V element, radicals of the hydrogen and ions of the hydrogen, the plurality of waveguides positioned on a side wall of the second chamber, the opening directed in longitudinal direction of the plurality of waveguides and protruding to an inside of the second chamber; and
a filter configured to selectively pass the radicals of the group V element and the radicals of the hydrogen to block the ions of the group V element and the ions of the hydrogen,
wherein the shower head is coated with at least one of a gallium nitride, an indium nitride, a gallium oxide, or an indium oxide, and
wherein the plurality of waveguides are located at a position between the nozzle and the shower head.

2. The semiconductor manufacturing apparatus according to claim 1, wherein
the nozzle is located closer to the substrate than is the shower head, and the plurality of waveguides are located closer to the shower head than to the nozzle.

3. The semiconductor manufacturing apparatus according to claim 1, wherein
the plurality of waveguides are configured to irradiate the microwave, the microwave having a frequency of about 2.45 GHz or about 5.8 GHz to the gas including the group V element.

4. The semiconductor manufacturing apparatus according to claim 1, wherein
the plurality of waveguides are located at approximately equal intervals on a concentric circle around a center axis of the reaction chamber.

5. The semiconducting manufacturing apparatus according to claim 1, wherein the plurality of waveguides include a pair of longer sides connected to a pair of shorter sides.

6. The semiconducting manufacturing apparatus according to claim 1, wherein a number of waveguides of the plurality of waveguides is in a range of 4 to 7.

7. The semiconducting manufacturing apparatus according to claim 1, wherein the shower head comprises an insulator that is transmissive to the microwave irradiated by the plurality of waveguides.

8. The semiconductor manufacturing apparatus according to claim 1, wherein the filter is separated from the nozzle, and is connected to a side surface of the reaction chamber at an end portion of the reaction chamber.

9. The semiconducting manufacturing apparatus according to claim 1, wherein the group V element is nitrogen.

10. The semiconducting manufacturing apparatus according to claim 1, wherein the plurality of waveguides are rectangular.

11. The semiconducting manufacturing apparatus according to claim 10, wherein a long side of the rectangular waveguides is larger than half of the wavelength of the microwave.

12. The semiconducting manufacturing apparatus according to claim 11, wherein the long side of the rectangular waveguides is larger than 6.12 centimeters.

13. The semiconductor manufacturing apparatus according to claim 1, wherein the filter is located at a position between the nozzle and the shower head.

14. The semiconductor manufacturing apparatus according to claim 1, wherein the filter is located at a position between the nozzle and the plurality of waveguides.

15. The semiconductor manufacturing apparatus according to claim 1, wherein a frequency band of the microwave is about 5.8 GHz, and the openings of the plurality of waveguides are in rectangle shapes, each opening having a first side and a second side which is longer than the first side, a length of the second side is about 2.585 cm.

16. The semiconductor manufacturing apparatus according to claim 1, wherein a frequency band of the microwave is about 2.45 GHz, and the openings of the plurality of waveguides are in rectangle shapes, each opening having a first side and a second side which is longer than the first side, a length of the second side is equal to or more than 6.12 cm.

* * * * *